United States Patent
Zhao et al.

(10) Patent No.: US 9,742,349 B2
(45) Date of Patent: Aug. 22, 2017

(54) PV JUNCTION UNIT, PV JUNCTION BOX AND METHOD FOR MONITORING CURRENT IN PV STRING

(71) Applicants: BOE TECHNOLOGY GROUP CO., LTD., Beijing (CN); BEIJING BOE ENERGY TECHNOLOGY CO., LTD., Beijing (CN)

(72) Inventors: Peng Zhao, Beijing (CN); Xiaoyan Han, Beijing (CN); Ping Zheng, Beijing (CN); Peihuan Yang, Beijing (CN); Hangbin Song, Beijing (CN)

(73) Assignees: BOE TECHNOLOGY GROUP CO., LTD., Beijing (CN); BEIJING BOE ENERGY TECHNOLOGY CO., LTD., Beijing (CN)

( * ) Notice: Subject to any disclaimer, the term of this patent is extended or adjusted under 35 U.S.C. 154(b) by 412 days.

(21) Appl. No.: 14/473,329

(22) Filed: Aug. 29, 2014

(65) Prior Publication Data

US 2015/0357968 A1 Dec. 10, 2015

(30) Foreign Application Priority Data

Jun. 4, 2014 (CN) .......................... 2014 1 0245098

(51) Int. Cl.
*H02S 40/34* (2014.01)
*H02S 40/36* (2014.01)
(Continued)

(52) U.S. Cl.
CPC .............. *H02S 40/34* (2014.12); *G01R 1/203* (2013.01); *G01R 29/00* (2013.01); *H02S 40/36* (2014.12); *H02S 50/00* (2013.01)

(58) Field of Classification Search
CPC ......... H02S 40/34; H02S 50/00; G01R 29/00; G01R 1/203
See application file for complete search history.

(56) References Cited

U.S. PATENT DOCUMENTS

2003/0088374 A1* 5/2003 Slater ..................... G01R 35/04
702/61
2011/0320146 A1* 12/2011 Watanabe ............ G01R 31/343
702/65
(Continued)

FOREIGN PATENT DOCUMENTS

CN 102109578 A 6/2011
CN 202171616 U 3/2012
(Continued)

OTHER PUBLICATIONS

CN2013103330 Human Translation.*
(Continued)

*Primary Examiner* — Daniel Cavallari
*Assistant Examiner* — James Evans
(74) *Attorney, Agent, or Firm* — Kinney & Lange, P.A.

(57) ABSTRACT

A PV junction unit for joining a plurality of PV strings into a single string, comprising: a plurality of anode branch circuits; an anode busbar adapted to connect with an anode output end of each PV string via one corresponding anode branch circuit; a plurality of cathode branch circuits; a cathode busbar adapted to connect with a cathode output end of each PV string via one corresponding cathode branch circuit; resistors each of which is connected in series in one corresponding anode branch circuit connecting the anode output end of one corresponding PV string with the anode busbar, wherein each resistor has a theoretical resistance; voltage measuring devices each of which is connected in parallel with one corresponding resistor; and a processor connected with each of the voltage measuring devices, the processor configured to determine a current value in one PV string at least based on the theoretical resistance of the resistor in one anode branch circuit connected with the one PV string and based on a voltage value from the voltage (Continued)

measuring device in said one anode branch circuit connected with the one PV string.

14 Claims, 6 Drawing Sheets

(51) Int. Cl.
*G01R 1/20* (2006.01)
*G01R 29/00* (2006.01)
*H02S 50/00* (2014.01)

(56) References Cited

U.S. PATENT DOCUMENTS

| | | | | |
|---|---|---|---|---|
| 2012/0053867 | A1* | 3/2012 | Dunn | H02S 50/10 702/58 |
| 2012/0218022 | A1* | 8/2012 | Lazarov | G01R 19/0092 327/362 |
| 2013/0211751 | A1* | 8/2013 | Park | G01R 21/06 702/61 |
| 2013/0307556 | A1* | 11/2013 | Ledenev | H02S 50/10 324/509 |

FOREIGN PATENT DOCUMENTS

| | | |
|---|---|---|
| CN | 202797008 U | 3/2013 |
| CN | 203103330 U | 7/2013 |
| CN | 203117714 U | 8/2013 |
| CN | 203119796 U | 8/2013 |

OTHER PUBLICATIONS

STIC Search Request.*
First Chinese Office Action (and English translation) dated Nov. 27, 2015, for corresponding Chinese Application No. 201410245098.7.

* cited by examiner

PV JUNCTION UNIT, PV JUNCTION BOX AND METHOD FOR MONITORING CURRENT IN PV STRING

CROSS-REFERENCE TO RELATED APPLICATION

This application claims the benefit of Chinese Patent Application No. 201410245098.7 filed on Jun. 4, 2014 in the State Intellectual Property Office of China, the whole disclosure of which is incorporated herein by reference.

BACKGROUND OF THE INVENTION

Field of the Invention

The embodiments of the present invention relate to a field of photovoltaic (PV) power generation technology, and more particularly, relate to a PV junction unit, a PV junction box having the same, and a method for monitoring a current in each PV string of a plurality of PV strings which are then joined into a single string.

Description of the Related Art

In current PV power generation systems, in order to reduce wires between PV cells and an inverter, PV cells of the same spec are first connected in series to form a PV string, then a plurality of PV strings are introduced into a PV junction box in a parallel way, the PV strings are joined in the junction box to form a single string, and then the formed string is led out to the inverter.

The current PV junction box usually comprises a fuse, an anode busbar, a cathode busbar and a circuit breaker, wherein for the plurality of PV strings, an anode output end of each PV string is connected to an anode busbar via the fuse, and an output end of the anode busbar is connected to an anode input end of the circuit breaker; a cathode output end of each PV string is connected to a cathode busbar, and an output end of the cathode busbar is connected to a cathode input end of the circuit breaker; and an anode output end and a cathode output end of the circuit breaker are connected to the inverter.

In order to exactly know the operation state of each PV string in time, it is necessary to monitor the current in each PV string.

SUMMARY OF THE INVENTION

Embodiments of the present invention are directed to provide a PV junction unit so as to monitor current in each PV string.

According to one aspect of the embodiments of the present invention, a PV junction unit for joining a plurality of PV strings into a single string is provided, wherein each PV string has an anode output end and a cathode output end. The PV junction unit comprises:

an anode busbar;

a plurality of anode branch circuits, each of which connects the anode output end of one corresponding PV string with the anode busbar;

a cathode busbar;

a plurality of cathode branch circuits, each of which connects the cathode output end of one corresponding PV string with the cathode busbar;

resistors each of which is connected in series in one corresponding anode branch circuit and has a theoretical resistance;

voltage measuring devices each of which is connected in parallel with one corresponding resistor; and a processor connected with each of the voltage measuring devices and configured to determine a current value in one PV string at least based on the theoretical resistance of the resistor in one anode branch circuit connected with the one PV string and based on a voltage value from the voltage measuring device in said one anode branch circuit connected with the one PV string.

In an alternative embodiment of the present invention, the anode branch circuits comprise a first anode branch circuit in which a current measuring device is connected in series and other anode branch circuits in each of which no current measuring device is connected in series, wherein the current measuring device is connected to the processor, wherein, for the first anode branch circuit: the processor is configured to get the current value from the current measuring device and use the measured current value as the current value in the PV string connected with the first anode branch circuit, and the processor is configured to determine the actual resistance of the resistor in the first anode branch circuit based on the measured current value and the voltage value obtained by the voltage measuring device in the first anode branch circuit; and for each of said other anode branch circuits: the processor is configured to determine the actual resistance of the resistor in each of other anode branch circuits based on the theoretical resistance of the resistor in said other anode branch circuit and based on the theoretical resistance and actual resistance of the first anode branch circuit; and the processor is configured to determine the current value of one corresponding PV string connected with said other anode branch circuit based on the actual resistance of the resistor in said other anode branch circuit and the voltage value obtained by the voltage measuring device in said other anode branch circuit.

According to another aspect of the embodiments of the present invention, a method for monitoring a current in a PV string is provided, the method is used for monitoring a current in each PV string of a plurality of PV strings which are joined into a single string, wherein the plurality of PV strings are connected with an anode busbar through a plurality of anode branch circuits respectively, the method comprising steps of:

connecting in series a resistor to each anode branch circuit, wherein the resistor has a theoretical resistance;

providing a voltage measuring device in each anode branch circuit, the voltage measuring device is connected in parallel with the resistor in one corresponding anode branch circuit to measure the voltage thereof; and determining a current value in one PV string at least based on the theoretical resistance of the resistor in one anode branch circuit connected with the one PV string, and based on a voltage value from the voltage measuring device in said one anode branch circuit connected with the one PV string.

In an alternative embodiment of the present invention, the plurality of anode branch circuits comprise a first anode branch circuit in which a current measuring device is connected in series and other anode branch circuits in each of which no current measuring device is connected in series; and the method further comprising steps of:

determining the actual resistance of the resistor in the first anode branch circuit based on the current value obtained by the current measuring device and the voltage value obtained by the voltage measuring device in the first anode branch circuit, and using the current value obtained by the current measuring device as the current value in the PV string connected with the first anode branch circuit;

determining the actual resistance of the resistor in said other anode branch circuit based on the actual resistance and theoretical resistance of the resistor in the first anode branch circuit; and determining a current value in one PV string connected with said other anode branch circuit based on the voltage value obtained by the voltage measuring device and the actual resistance of the resistor in said other anode branch circuit.

According to still another aspect of the embodiments of the present invention, a PV junction box is provided, the PV junction box comprises the above PV junction unit; a plurality of fuses each of which is connected in series in one corresponding anode branch circuit; and a circuit breaker comprising an anode input end and a cathode input end, an output end of the anode busbar is connected with the anode input end, and an output end of the cathode busbar is connected with the cathode input end.

BRIEF DESCRIPTION OF THE DRAWINGS

The above and other features of the present invention will become more apparent by describing in detail exemplary embodiments thereof with reference to the accompanying drawings, in which.

DETAILED DESCRIPTION OF PREFERRED EMBODIMENTS OF THE INVENTION

Figure 1:
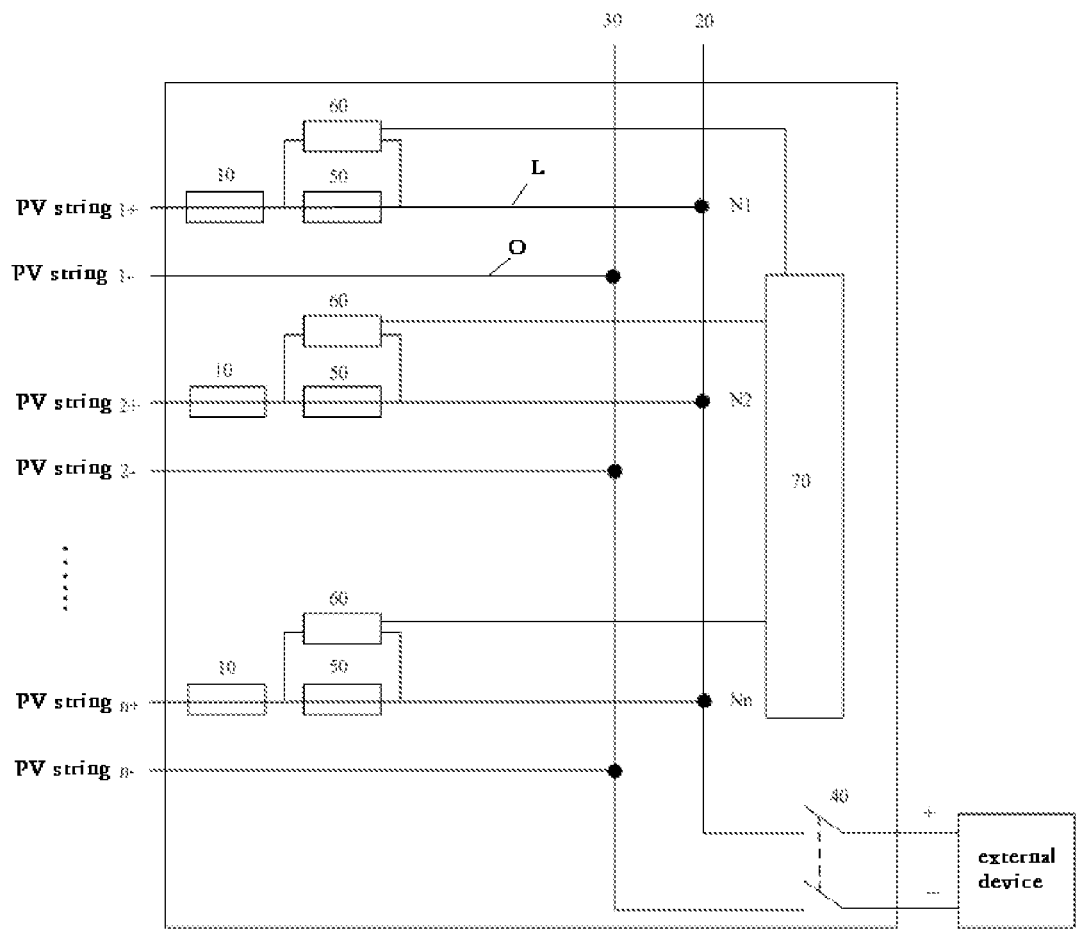
FIG. 1 is a schematic view showing the structure of a PV junction unit according to a first embodiment of the present invention.

Exemplary embodiments of the present disclosure will be described hereinafter in detail with reference to the attached drawings, wherein the like reference numerals refer to the like elements. The present disclosure may, however, be embodied in many different forms and should not be construed as being limited to the embodiment set forth herein; rather, these embodiments are provided so that the present disclosure will be thorough and complete, and will fully convey the concept of the disclosure to those skilled in the art.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Referring to FIG. 1, a PV junction unit according to an exemplary embodiment of the present invention is used for joining a plurality of PV strings into a single string, wherein each PV string has an anode output end and a cathode output end, and the PV junction unit comprises:

an anode busbar 20;

a plurality of anode branch circuits L, each of which connects the anode output end of one corresponding PV string with the anode busbar 20, as shown in FIG. 1, each anode branch circuit L is connected with the anode busbar 20 at a connection point Ni, i=1, 2 . . . n;

a cathode busbar 30;

a plurality of cathode branch circuits 0, each of which connects the cathode output end of one corresponding PV string with the cathode busbar;

resistors 50 each of which is connected in series in one corresponding anode branch circuit L, wherein each resistor 50 has a theoretical resistance;

voltage measuring devices 60 each of which is connected in parallel with one corresponding resistor 50; and a processor 70 connected with each of the voltage measuring devices 60 and configured to determine a current value in one PV string at least based on the theoretical resistance of the resistor in one anode branch circuit connected with the one PV string and based on a voltage value from the voltage measuring device 60 in said one anode branch circuit connected with the one PV string.

The processor 70 may store in advance the theoretical resistance of the resistor 50 of each PV string. In an alternative embodiment of the present invention, for each PV string, the processor 70 may calculate the quotient of the voltage value obtained by the voltage measuring device and the theoretical resistance of the corresponding resistor, and regards the quotient as the current value in the PV string.

The specific manner in which the processor 70 determines the current value in the PV string will be described below, taking the first PV string in FIG. 1 as an example.

The anode output end of the first PV string is indicated as 1+, the first anode branch circuit L is connected with the anode output end at a connecting point indicated as Ni;

The resistor 50 is connected in series between the anode output end 1+ and the connecting point N1, that is, in the first anode branch circuit, and the voltage measuring device 60 is connected in parallel with the resistor 50, the voltage measuring device 60 being connected with the processor 70;

The processor 70 uses the voltage value obtained by the voltage measuring device 60 as U1, and determines the current value in the first PV string based on the stored theoretical resistance R1 of the resistor 50 and the voltage value U1.

By means of the voltage value measured by the voltage measuring device 60 and the theoretical resistance R1 of the resistor 50 stored in advance, the above embodiment of the present invention may provide the current value in each PV string. Since the cost of the resistor is low, the cost of the PV junction unit for monitoring the current in each PV string according to the present invention is also low.

In addition, since the volume of the resistor is small, the volume of the PV junction unit for monitoring the current in each PV string according to the present invention is also small.

The resistor 50 may be provided at any position in the anode branch circuit, that is, at any position between the anode output end of the PV string and the connecting point of the anode branch circuit and the anode busbar.

As shown in FIG. 1, in the case that a fuse 10 is connected in series in the anode branch circuit L, the resistor 50 may be connected between the fuse 10 and the connecting point of the anode branch circuit and the anode busbar. The fuse 10 is connected to the anode output end of the PV string, and when the current value in the PV string is excessive, the fuse performs overcurrent protection to prevent the resistor and the voltage measuring device connected in parallel with the resistor from being damaged.

It is noted that the number of the resistor connected in series in the anode branch circuit may be one or more. When several resistors are connected in series in the anode branch circuit, the voltage measuring device is connected in parallel with said several resistors.

The resistor 50 may be of any type, for example, a precision resistor. When a precision resistor is used, the accuracy for determining the current value in the PV string is improved.

The voltage measuring device 60 may be of any type that can measure the resistor voltage, for example, a voltmeter, a universal meter, a voltage sensor, or a differential-input type analog-to-digital conversion chip.

When a differential-input type analog-to-digital conversion chip is used, the accuracy for measuring the resistor voltage will be improved, and thus the accuracy for determining the current value in the PV string is improved; further, the volume of the PV junction unit remains small.

Figure 2:
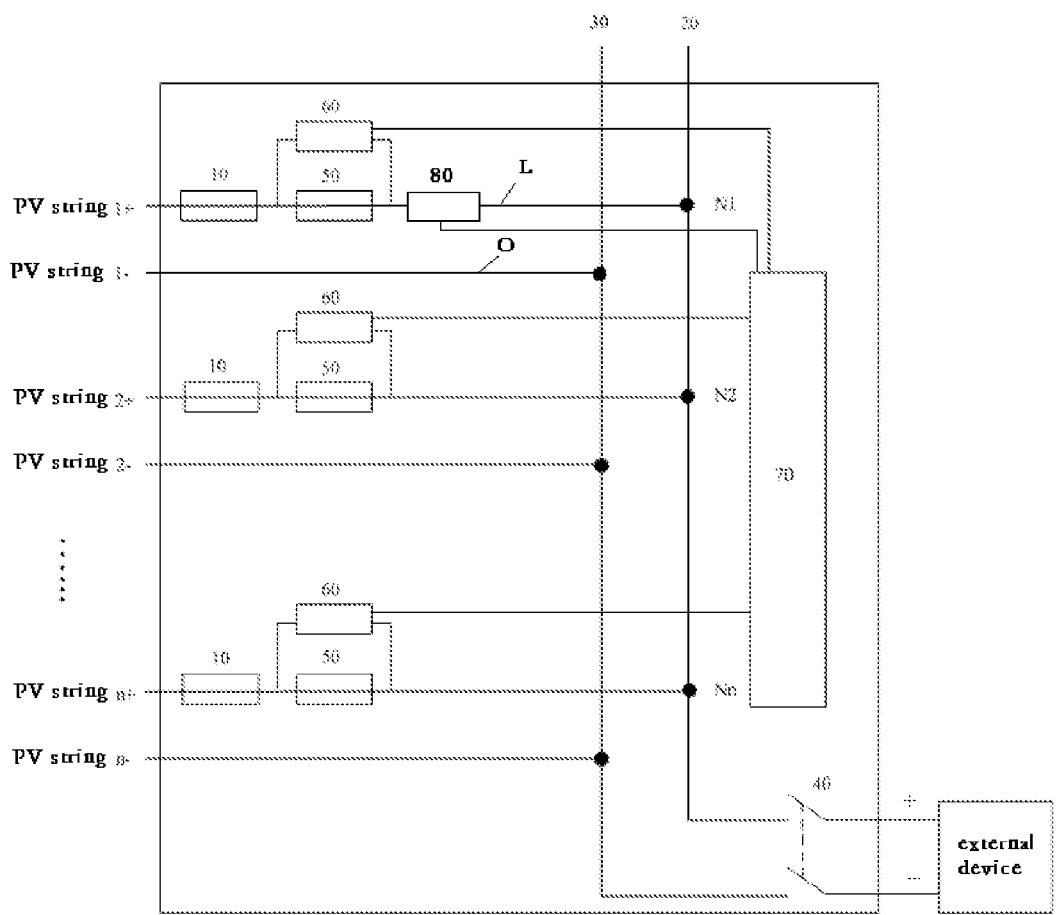
FIG. 2 is a schematic view showing the structure of a PV junction unit according to a second embodiment of the present invention.

FIG. 2 shows a PV junction unit according to a second exemplary embodiment of the present invention. The PV junction unit in FIG. 2 different from that in FIG. 1 only in that the PV junction unit in FIG. 2 further comprises a current measuring device 80 which is connected in series in the first anode branch circuit, that is connected in series between the anode output end of the PV string and the connecting point Ni (i=1, 2 . . . n), the current measuring device 80 is also connected to the processor 70.

For the first anode branch circuit in which the current measuring device is connected in series: the processor 70 is configured to get the current value from the current measuring device 70 and use the measured current value as the current value in the PV string connected with the first anode branch circuit, and the processor is configured to determine the actual resistance of the resistor 50 in the first anode branch circuit based on the measured current value and the voltage value obtained by the voltage measuring device 60 in the first anode branch circuit.

For each of the anode branch circuits in each of which no current measuring device is connected in series: the processor 70 is configured to determine the actual resistance of the resistor in each of the anode branch circuits in each of which no current measuring device is connected in series, based on the theoretical resistance of the resistor in the anode branch circuit in which no current measuring device is connected in series and based on the theoretical resistance and actual resistance of the first anode branch circuit in which the current measuring device is connected in series; and the processor is configured to determine the current value of one corresponding PV string connected with the anode branch circuit in which no current measuring device is connected in series, based on the actual resistance of the resistor and the voltage value obtained by the voltage measuring device in the anode branch circuit in which no current measuring device is connected in series.

The specific manner in which the processor 70 determines the current value in a first PV string and a second PV string will be described below, taking the embodiment shown in FIG. 2 in which the current measuring device 80 is connected in series in the first anode branch circuit as an example.

As shown in FIG. 2, the anode output end of the first PV string is indicated as 1+, the first anode branch circuit L is connected with the anode output end 1+ at a connecting point indicated as N1; the anode output end of the second PV string is indicated as 2+, the second anode branch circuit L is connected with the anode output end of the second PV string at a connecting point indicated as N2;

The resistor 50 and the current measuring device 80 are connected in series between the anode output end 1+ and the connecting point N1, that is, in the first anode branch circuit; and the voltage measuring device 60 is connected in parallel with the resistor 50, the voltage measuring device 60 being connected with the processor 70;

For the first anode branch circuit which is connected with the first PV string and in which the current measuring device is connected in series: the processor 70 is configured to get the current value I1 obtained by the current measuring device 80, and to use the current value I1 as the current value in the first PV string connected with the first anode branch circuit;

The processor 70 is configured to determine the actual resistance R1' of the resistor 50 in the first anode branch circuit based on the voltage value U1 obtained by the voltage measuring device 60 in the first anode branch circuit and based on the current value I1.

For the second anode branch circuit which is connected with the second PV string and in which no current measuring device is connected in series: the processor 70 is configured to determine the actual resistance of the resistor 50 in the second anode branch circuit, based on the theoretical resistance R2 of the resistor 50 in the second anode branch circuit and based on the theoretical resistance R1 and actual resistance R1' of the first anode branch circuit; and the processor 70 is configured to determine the current value I2 in the second PV string connected with the second anode branch circuit, based on the actual resistance R2' of the resistor 50 and the voltage value U2 obtained by the voltage measuring device in the second anode branch circuit.

In practice, the temperature within the PV junction unit varies with time, and the resistance drift of the resistor may occur, that is, the actual resistance of the resistor may be different from the theoretical resistance thereof.

In the embodiments of the present invention, the current measuring device is connected in series in one anode branch circuit for one PV string, and the actual resistance of the resistor in the one anode branch circuit is easily determined, and then the actual resistances of other resistors in other anode branch circuits are determined, and further, the actual current values in other PV strings connected with other anode branch circuits respectively are determined. That is, by providing the current measuring device in one anode branch circuit to calibrate the resistance drift, caused by temperature change, of other resistors in other anode branch circuits, so as to improve the accuracy of the current value in each PV string.

In practice, the current measuring device is connected in series only in one anode branch circuit. Thus, the PV junction unit according to the present invention may determine the current value in each PV string with accuracy and with low cost and small volume of the PV junction unit.

Similar to the resistor, the current measuring device 80 may be connected in series at any position in the anode branch circuit.

As mentioned above, the embodiments of the present invention also relate to a method for monitoring a current in a PV string, for monitoring a current in each PV string of a plurality of PV strings which are joined into a single string, wherein the plurality of PV strings are connected with an anode busbar through a plurality of anode branch circuits respectively, the method comprising steps of: connecting in series a resistor to each anode branch circuit, wherein the resistor has a theoretical resistance; providing a voltage measuring device in each anode branch circuit, the voltage measuring device is connected in parallel with the resistor in one corresponding anode branch circuit to measure the voltage thereof; and determining a current value in one PV string at least based on the theoretical resistance of the resistor in one anode branch circuit connected with the one PV string, and based on a voltage value from the voltage measuring device in said one anode branch circuit connected with the one PV string.

In practice, as shown in FIG. 2, when a fuse 10 is connected in series in the anode branch circuit, the current measuring device 80 is connected in series between the fuse and the connecting point of the anode branch circuit and the anode busbar. The fuse 10 is connected to the anode output end of the PV string, and when the current value in the PV string is excessive, the fuse performs overcurrent protection, so as to prevent the resistor and the current measuring device from being damaged.

The current measuring device 80 may be of any type that can measure the current in each anode branch circuit or in each PV string, for example, an ammeter, a universal meter or a current sensor.

The current measuring device 80 may be a high-precision current sensor, for instance, a Hall current sensor. When a high-precision current sensor is applied, the accuracy of the current value in each PV string is improved.

The processor 70 may get the current value from the current measuring device and the voltage values from the voltage measuring devices in a periodical way, so as to determine periodically the current value in each PV string. The period of getting the current value and the voltage values may be set according to experiences or actual requirements, for example, the period is set to be one hour based on actual experiences.

Alternatively, the processor may get the current value from the current measuring device and the voltage values from the voltage measuring devices under instructions from other equipment or device, so as to determine the current value in each PV string.

The processor, for the anode branch circuit which is connected with one PV strip and in which the current measuring device is connected in series, may calculate the quotient of the voltage value obtained by the voltage measuring device and the theoretical resistance of the resistor in the anode branch circuit, and regards the quotient as the current value in the one PV string.

For other anode branch circuits each of which is connected to one corresponding PV string and in each of which no current measuring device is connected in series, any method or manner, by which the processor may determine the actual resistance of the resistor in said other anode branch circuit based on the theoretical resistance thereof, and based on the theoretical resistance and actual resistance of the resistor in the anode branch circuit with the current measuring device, may be applied to the embodiments of the present invention.

For example, the current measuring device is connected in series in the anode branch circuit which is connected with the x-th PV string, and no current measuring device is connected in series in the anode branch circuit which is connected with the y-th PV string. If the theoretical resistance and actual resistance of the resistor in the anode branch circuit connected with the x-th PV string are Rx and Rx' respectively, and the theoretical resistance of the resistor in the anode branch circuit that is connected with the y-th PV string is Ry, the actual resistance Ry' in the anode branch circuit that is connected with the y-th PV string is calculated according to the following formula:

$$Ry'=Rx'\times Ry/Rx, \text{ or } Ry'=(Rx'-Rx)+Ry.$$

The processor, for the anode branch circuit in which the current measuring device is not connected in series and which is connected with the y-th PV string, may calculate the quotient of the voltage value obtained by the voltage measuring device and the theoretical resistance of the resistor in the anode branch circuit, and regards the quotient as the current value in the y-th PV string.

Further, in order to prevent the theoretical resistances of the resistors from being input manually into the processor by error and thus prevent the current values in the PV strings from being determined inaccurately, the theoretical resistance of the resistor in each anode branch circuit may be calibrated before the PV junction unit goes out, the calibrating step comprises steps of:

applying the same current to each anode branch circuit, and obtaining voltage values of the resistors in the anode branch circuits;

using ratios among voltage values of the resistors of the anode branch circuits as theoretical resistance ratios for the resistors of the anode branch circuits; and calibrating the theoretical resistance of the resistor in the corresponding anode branch circuit based on the theoretical resistance ratios.

Figure 3:
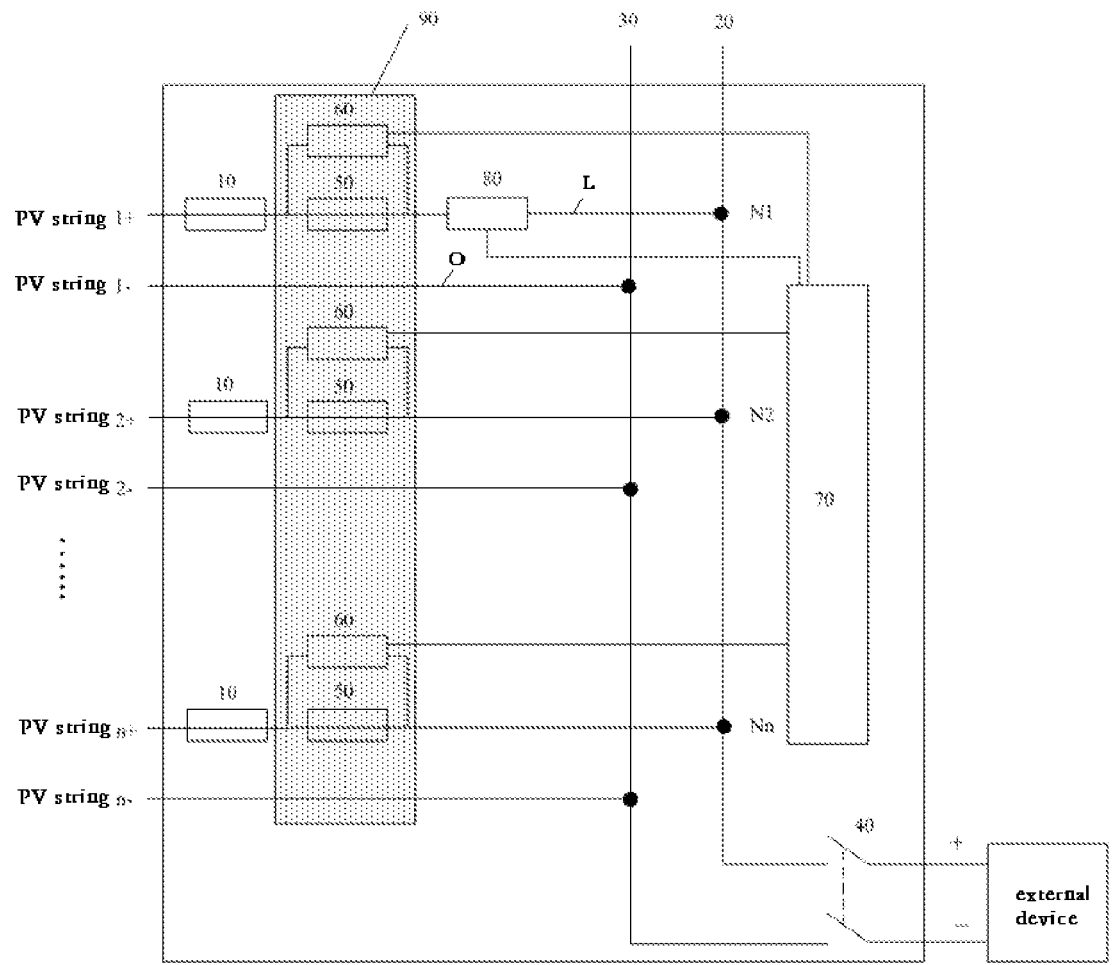
FIG. 3 is a schematic view showing the structure of a PV junction unit according to a third embodiment of the present invention.

FIG. 3 shows the structure of the PV junction unit according to the third embodiment of the present invention. The difference between the PV junction unit in FIG. 3 and the PV junction unit in FIG. 2 in that the PV junction unit in FIG. 3 further comprises a cooling board 90 which is in thermal contact with all the resistors 50.

In practice, the resistors 50 are located to the cooling board 90, thus, the resistance changes of the resistors 50 due to temperature drift are substantially the same. In this case, the resistances of the resistors in respective PV strings obtained through calibration with the current measuring device are close to their actual resistance values respectively. Therefore, the precision of determining the current values in the respective PV strings is further improved.

In an alternative embodiment of the present invention, the cooling board may be provided in the PV junction unit shown in FIG. 1.

Figure 4:
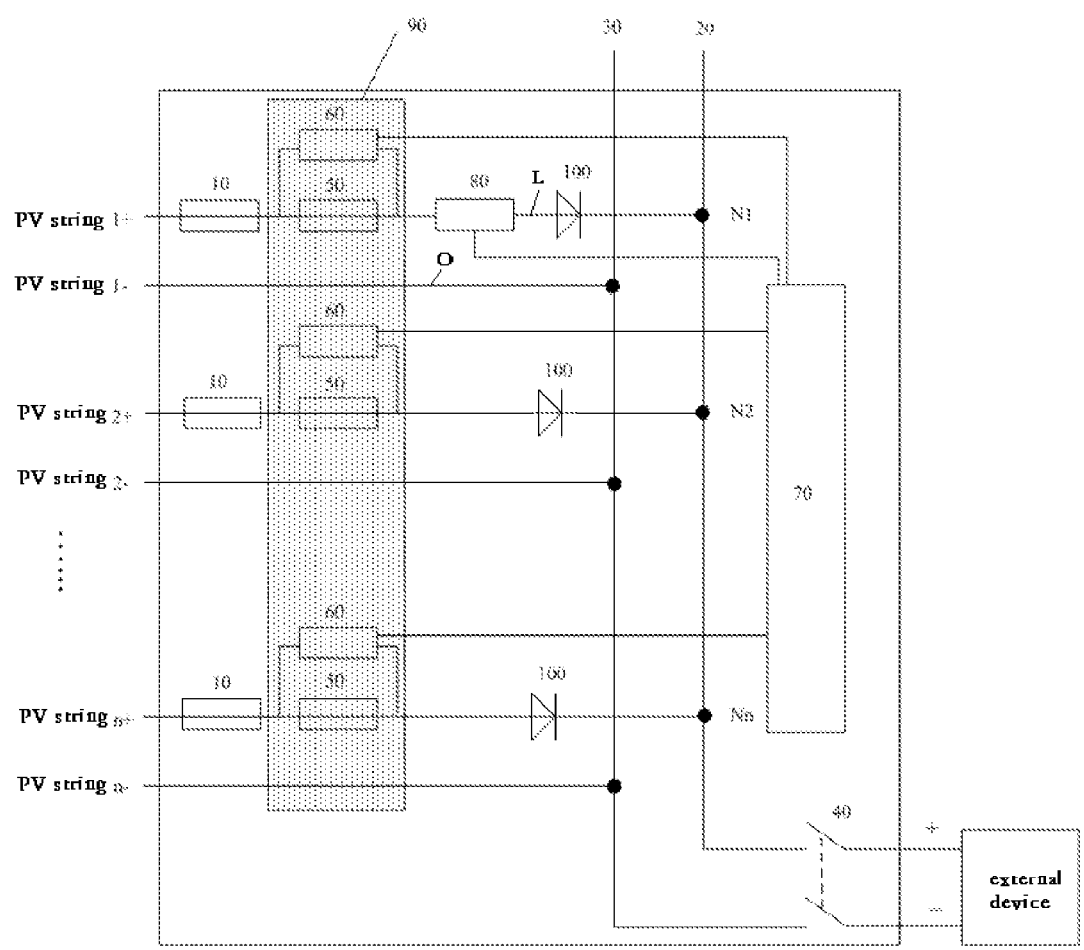
FIG. 4 is a schematic view showing the structure of a PV junction unit according to a fourth embodiment of the present invention.

FIG. 4 shows the structure of the PV junction unit according to the fourth embodiment of the present invention. The difference between the PV junction unit in FIG. 4 and the PV junction unit in FIG. 3 in that the PV junction unit in FIG. 4 further comprises anti-reverse diodes 100 each of which is connected in series between the anode output end of one corresponding PV string and the connecting point Ni (i=1, 2 . . . n) of one corresponding anode branch circuit and the anode busbar 20, that is, in one corresponding anode branch circuit connecting the anode busbar and the anode output end of one corresponding PV string.

With the anti-reverse diode, the damages to the PV strings caused by reverse connection are prevented.

Alternatively, the anti-reverse diode may be provided to the PV junction units shown in FIGS. 1-2.

Figure 5:
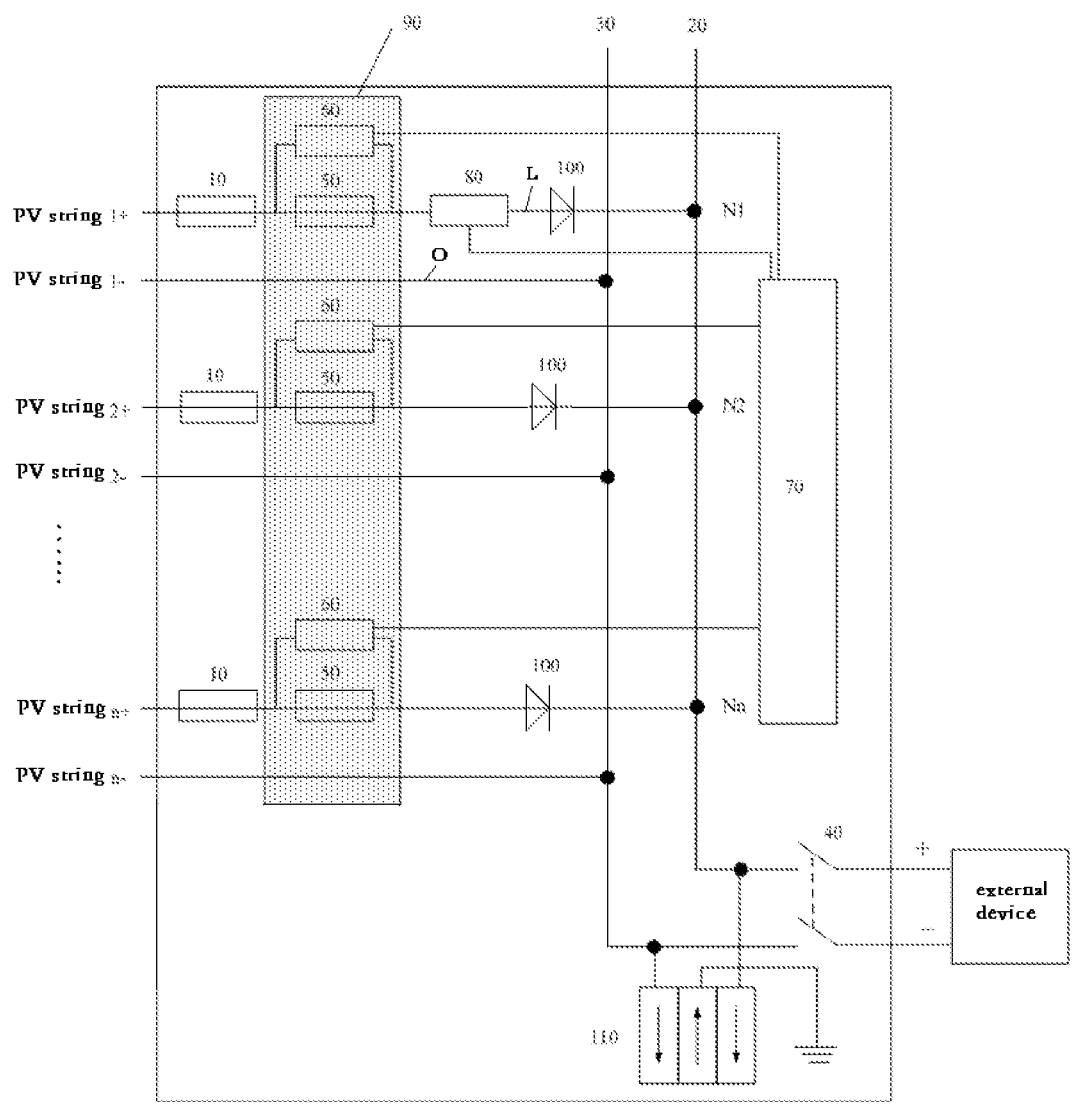
FIG. 5 is a schematic view showing the structure of a PV junction unit according to a fifth embodiment of the present invention.

FIG. 5 shows the structure of the PV junction unit according to the fifth embodiment of the present invention. The difference between the PV junction unit in FIG. 5 and the PV junction unit in FIG. 4 in that the PV junction unit in FIG. 5 further comprises a surge protection device 110, wherein an anode input end of the surge protection device 110 is connected with an output end of the anode busbar 20, and a cathode input end of the surge protection device 110 is connected with an output end of the cathode busbar 30.

With the surge protection device 110, the PV junction unit is protected from lightning strike.

The surge protection device 110 may also be provided in the PV junction units shown in FIGS. 1-3.

Figure 6:
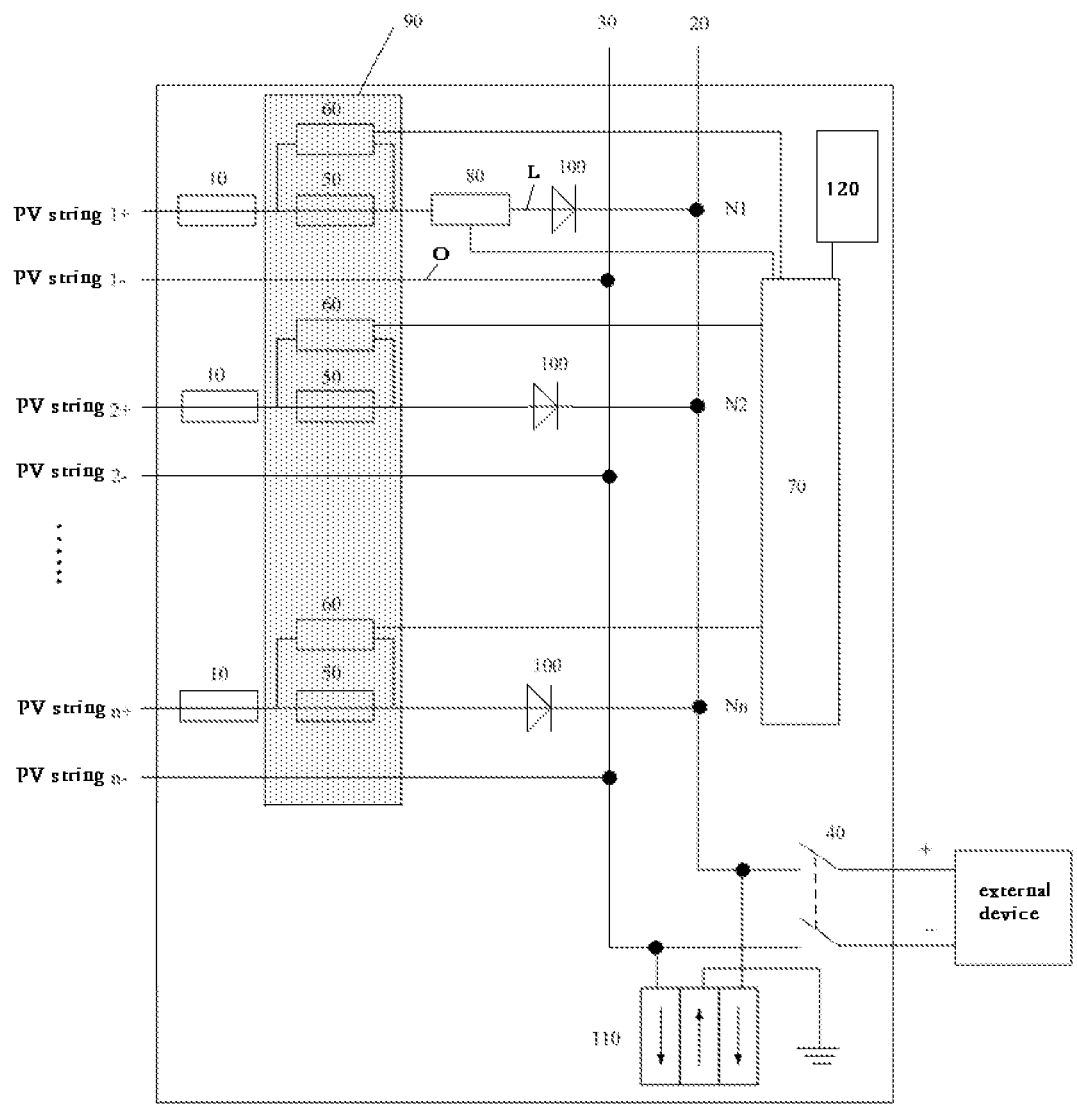
FIG. 6 is a schematic view showing the structure of a PV junction unit according to a six embodiment of the present invention.

FIG. 6 shows the structure of the PV junction unit according to the sixth embodiment of the present invention. The difference between the PV junction unit in FIG. 6 and the PV junction unit in FIG. 5 in that the PV junction unit in FIG. 6 further comprises a communication chip 120 connected with the processor 70, for sending the current values of the PV strings determined by the processor 70.

With the communication chip 120, the PV junction unit according to the present invention may communicate data with external devices so as to achieve remote monitoring for the PV junction unit.

The communication chip 120 may be provided to the PV junction units in FIGS. 1-4.

The embodiments of the present invention also relate to a PV junction box comprising: the above PV junction unit; a plurality of fuses 10 each of which is connected in series in one corresponding anode branch circuit; and a circuit breaker 40 comprising an anode input end and a cathode input end, an output end of the anode busbar 20 is connected with the anode input end, and an output end of the cathode busbar 30 is connected with the cathode input end. An anode output end and a cathode output end of the circuit breaker 40 may be connected to an external device, such as an inverter.

Although several exemplary embodiments have been shown and described, it would be appreciated by those skilled in the art that various changes or modifications may be made in these embodiments without departing from the principles and spirit of the disclosure, the scope of which is defined in the claims and their equivalents.

what is claimed is:

1. A PV junction unit for joining a plurality of PV strings into a single string, wherein each PV string has an anode output end and a cathode output end, the PV junction unit comprising:
   an anode busbar;
   a plurality of anode branch circuits, each of which connects the anode output end of one corresponding PV string with the anode busbar;
   a cathode busbar;
   a plurality of cathode branch circuits, each of which connects the cathode output end of one corresponding PV string with the cathode busbar;
   resistors each of which is connected in series in one corresponding anode branch circuit and has a theoretical resistance;
   voltage measuring devices each of which is connected in parallel with one corresponding resistor; and
   a processor connected with each of the voltage measuring devices and configured to determine a current value in one PV string at least based on the theoretical resistance of the resistor in one anode branch circuit connected with the one PV string and based on a voltage value from the voltage measuring device in said one anode branch circuit connected with the one PV string;
   wherein:
   the plurality of anode branch circuits comprise a first anode branch circuit connected in series with a current measuring device, and other anode branch circuits in each of which no current measuring device is connected in series, wherein the current measuring device is connected to the processor;
   for the first anode branch circuit: the processor is configured to get a measured current value from the current measuring device and use the measured current value as the current value in the PV string connected with the first anode branch circuit, and the processor is configured to determine an actual resistance of the resistor in the first anode branch circuit based on the measured current value and the voltage value obtained by the voltage measuring device in the first anode branch circuit; and
   for each of said other anode branch circuits: the processor is configured to determine the actual resistance of the resistor in each of other anode branch circuits, based on the theoretical resistance of the resistor in said other anode branch circuit and based on the theoretical resistance and actual resistance of the first anode branch circuit; and the processor is configured to determine the current value of one corresponding PV string connected with said other anode branch circuit based on the actual resistance of the resistor in said other anode branch circuit and the voltage value obtained by the voltage measuring device in said other anode branch circuit.

2. The PV junction unit of claim 1, wherein the current measuring device comprises a high-precision current sensor.

3. The PV junction unit of claim 2, wherein the high-precision current sensor comprises a Hall current sensor.

4. The PV junction unit of claim 1, further comprising a cooling board which is in thermal contact with all the resistors.

5. The PV junction unit of claim 1, further comprising anti-reverse diodes each of which is connected in series in one corresponding anode branch circuit.

6. The PV junction unit of claim 1, further comprising a surge protection device, wherein an anode input end of the surge protection device is connected with an output end of the anode busbar, and a cathode input end of the surge protection device is connected with an output end of the cathode busbar.

7. The PV junction unit of claim 1, further comprising a communication chip connected with the processor, for sending the current values of the PV strings determined by the processor.

8. The PV junction unit of claim 1, wherein the voltage measuring device comprises a differential-input type analog-to-digital conversion chip.

9. The PV junction unit of claim 1, wherein the resistors are precision resistors.

10. A PV junction box comprising:
    the PV junction unit of claim 1;
    a plurality of fuses each of which is connected in series in one corresponding anode branch circuit; and
    a circuit breaker comprising an anode input end and a cathode input end, an output end of the anode busbar is connected with the anode input end, and an output end of the cathode busbar is connected with the cathode input end.

11. A method for monitoring a current in each PV string of a plurality of PV strings which are joined into a single string, wherein the plurality of PV strings are connected with an anode busbar through a plurality of anode branch circuits respectively, the method comprising steps of:
    connecting in series a resistor in each anode branch circuit, wherein the resistor has a theoretical resistance;
    providing a voltage measuring device in each anode branch circuit, the voltage measuring device being connected in parallel with the resistor in one corresponding anode branch circuit to measure the voltage thereof; and determining a current value in one PV string at least based on the theoretical resistance of the resistor in one anode branch circuit connected with the one PV string, and based on a voltage value from the voltage measuring device in said one anode branch circuit connected with the one PV string;

wherein:

the plurality of anode branch circuits comprise a first anode branch circuit in which a current measuring device is connected in series and other anode branch circuits in each of which no current measuring device is connected in series; and the method further comprising steps of:

determining an actual resistance of the resistor in the first anode branch circuit based on a measured current value obtained by the current measuring device and the voltage value obtained by the voltage measuring device in the first anode branch circuit, and using the measured current value obtained by the current measuring device as the current value in the PV string connected with the first anode branch circuit;

determining the actual resistance of the resistor in said other anode branch circuit based on the actual resistance and theoretical resistance of the resistor in the first anode branch circuit; and determining a current value in one PV string connected with said other anode branch circuit based on the voltage value obtained by the voltage measuring device and the actual resistance of the resistor in said other anode branch circuit.

12. The method of claim 11, wherein the theoretical resistance and actual resistance of the resistor in the first anode branch circuit are $Rx$ and $Rx'$ respectively, and the theoretical resistance of the resistor in said other anode branch circuit is $Ry$;

the actual resistance $Ry'$ in said other anode branch circuit is calculated according to the following formula:

$$Ry' = Rx' \times Ry / Rx.$$

13. The method of claim 11, wherein the theoretical resistance and actual resistance of the resistor in the first anode branch circuit are $Rx$ and $Rx'$ respectively, and the theoretical resistance of the resistor in said other anode branch circuit is $Ry$;

the actual resistance $Ry'$ in said other anode branch circuit is calculated according to the following formula:

$$Ry' = (Rx' - Rx) + Ry.$$

14. The method of claim 11, further comprising step of calibrating the theoretical resistance of the resistor in each anode branch circuit, the calibrating step comprises steps of:

applying the same current to each anode branch circuit, and obtaining voltage values of the resistors in the respective anode branch circuits;

using ratios among voltage values of the resistors of the respective anode branch circuits as theoretical resistance ratios for the resistors of the respective anode branch circuits; and calibrating the theoretical resistance of the resistor in the corresponding anode branch circuit based on the theoretical resistance ratios.

\* \* \* \* \*